United States Patent
Sandhu et al.

(10) Patent No.: US 6,358,756 B1
(45) Date of Patent: Mar. 19, 2002

(54) SELF-ALIGNED, MAGNETORESISTIVE RANDOM-ACCESS MEMORY (MRAM) STRUCTURE UTILIZING A SPACER CONTAINMENT SCHEME

(75) Inventors: Gurtej Sandhu; Roger Lee; Dennis Keller; Trung T. Doan; Max F. Hineman, all of Boise; Ren Earl, Merdian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/777,888

(22) Filed: Feb. 7, 2001

(51) Int. Cl.[7] .................. H01L 21/00; H01L 21/8234
(52) U.S. Cl. ................. 438/3; 438/238; 438/381
(58) Field of Search ................ 438/3, 238, 381; 257/295, 421, 422, 424, 425, 426; 365/158, 171, 173

(56) References Cited

U.S. PATENT DOCUMENTS

| | | | |
|---|---|---|---|
| 5,569,617 A | | 10/1996 | Veh et al. |
| 5,659,499 A | * | 8/1997 | Chen et al. ............... 365/158 |
| 5,732,016 A | | 3/1998 | Chen et al. |
| 5,768,181 A | * | 6/1998 | Zhu et al. ................. 365/158 |
| 5,838,608 A | | 11/1998 | Zhu et al. |
| 5,852,574 A | | 12/1998 | Naji |
| 5,902,690 A | | 5/1999 | Tracy et al. |
| 5,920,500 A | | 7/1999 | Tehrani et al. |
| 5,936,882 A | | 8/1999 | Dunn |
| 5,956,267 A | | 9/1999 | Hurst et al. |
| 6,081,445 A | | 6/2000 | Shi et al. |
| 6,114,719 A | * | 9/2000 | Dill et al. ................. 257/295 |
| 6,169,688 B1 | * | 1/2001 | Noguchi ................... 365/171 |
| 6,174,737 B1 | * | 1/2001 | Durlam et al. ............... 438/3 |
| 6,185,080 B1 | * | 2/2001 | Gill ........................ 360/324.2 |
| 6,210,810 B1 | * | 4/2001 | Ikarashi et al. ............. 428/611 |
| 6,219,274 B1 | * | 4/2001 | Shimazawa et al. ......... 365/158 |
| 6,261,893 B1 | * | 7/2001 | Chang et al. ................. 438/3 |
| 6,269,018 B1 | * | 7/2001 | Monsama et al. .......... 365/145 |
| 6,272,036 B1 | * | 8/2001 | You et al. ................... 365/97 |

OTHER PUBLICATIONS

MRAM New Ways to Store More <http://www.hp.com/ghp/features/storage/storage3/.html>. No Date.*
Nonvolatile Electronics, Inc. Magnetoresistive Random Access Memory (MRAM) <http://www.nve.com/otherbiz/mram.html>. No Date.*
Advanced Technology Program Magnetoresistive Technologies Attract a Growing Audience <http://www.nist.gov/public_affairs/factsheet/nve.htm>, Jan., 1999.*
Stuart Parkin, MagRAM, Non–Volatile Magnetic Random Sccess Memory <htt;://www.almaden.ibm.com/st/projects/magneto/mram/>, Mar. 29, 1999.*
Science and Technology at Almaden, Ma9netoelectronics <http://www.almaden.ibm.com/st/projects/magneto/index.html>. No Date.*
EDAtoolsCafe Motorola Demonstrates Revolutionary Memory Technology <http://www.dacafe.com/DACafe/NEWS/CorpNews2/20000513$_{13}$il$_{13}$motorol$_4$html>.*
Nanomagnetics <http://itri loyola.edu/nano/05_03.htm>, Sep., 1999.*

(List continued on next page.)

Primary Examiner—Michael S. Lebentritt
(74) Attorney, Agent, or Firm—Dickstein Shapiro Morin & Oshinsky LLP

(57) ABSTRACT

This invention pertains to a method of fabricating a MRAM structure and the resulting structure. The MRAM structure of the invention has the pinned layer recessed within a trench with the upper magnetic layer positioned over it. The method of MRAM fabrication utilizes a spacer processing technique, whereby the upper magnetic layer of the MRAM stack structure is formed between the region defined by the spacers, thereby allowing for self-alignment of the upper magnetic layer over the underlying pinned magnetic layer.

35 Claims, 7 Drawing Sheets

OTHER PUBLICATIONS

AsiaBizTech Advanced US MRAM Whips Chip Foes into R&D Catch-up <http://www.nikkeibp.asiabiztech.com/nea/200002/tech13feb. html>. Feb. 2000.*

Electronic Design Magnetoresistive Technology Holds Promise for Idea Memory Structures <http://www.el-ecdesign.com/magazine/1999oct2899/tbrk/1028bkp2.shtml>, Oct. 28, 1999.*

CMPnet Non–volatile RAM designed with magnetic spin valves http://www.edtn.com/news/July15/071598tnews5.html>. No Dates*

Magnetic Random Access Memory (MRAM) <http://www.imec.be/mcp/nmc/magneto/mram/mram.htm/>. No Date.*

Science and Technology At Almaden Magneto–Electronics: Magnetic Tunnel Junctions <http://www.almaden.ibm.com/st/projects/magneto/mtj/>. No Date.*

James Daughton, Magnetoresistive Rando Access Memory (MRAM), Feb. 4, 2000.*

* cited by examiner

SELF-ALIGNED, MAGNETORESISTIVE RANDOM-ACCESS MEMORY (MRAM) STRUCTURE UTILIZING A SPACER CONTAINMENT SCHEME

FIELD OF THE INVENTION

This invention pertains generally to a method of fabricating an MRAM structure, and more particularly, to an MRAM structure that has the pinned layer recessed within a trench with an upper magnetic layer positioned over it.

BACKGROUND OF THE INVENTION

Integrated circuit designers have always sought the ideal semiconductor memory: a device that is randomly accessible, can be written or read very quickly, is non-volatile, but indefinitely alterable, and consumes little power. Magnetoresistive random access memory (MRAM) technology has been increasingly viewed as offering all these advantages.

A magnetic memory element has a structure that includes magnetic layers separated by a non-magnetic layer. Information can be written and read as a "1" or a "0" as directions of magnetization vectors in these magnetic layers causing resistance variations. Magnetic vectors in one magnetic layer are magnetically fixed or pinned, while the magnetic vectors of the other magnetic layer are not fixed so that the magnetization direction is free to switch. In response to these shifting states, the magnetic memory element represents two different resistances or potentials, which are read by the memory circuit as either a "1" or a "0." It is the detection of these resistance or potential differences that allows the MRAM to read and write information.

It would be desirable to be able to fabricate higher density MRAM memory devices with increased precision, and with a reduced number of simplified steps. It would be desirable to be able to form one or more integrated MRAM devices so that accurate placement of the top magnetic layer over the bottom pinned magnetic layer can be assured. A self-aligned process would serve this purpose. It would be an advantage if such a process were easily repeatable so as to allow the fabrication of a plurality of layers of MRAM device integration.

SUMMARY OF THE INVENTION

This invention pertains to a method of fabricating an MRAM structure and the resulting structure. The MRAM structure of the invention has the pinned layer recessed within a trench with an upper unpinned magnetic layer positioned over it. The method of fabrication utilizes a spacer placed within an etched insulator opening to reduce the opening size. The upper magnetic layer of the MRAM stack structure is formed within the smaller size region defined by spacers, thereby allowing for accurate placement and self-alignment of the upper magnetic layer over the underlying pinned magnetic layer. This process is repeatable to form multiple MRAM device layers for heightened levels of vertical integration.

These and other feature and advantages of the invention will be more clearly understood from the following detailed description, which is provided with reference to the accompanying drawings.

DETAILED DESCRIPTION OF THE PREFERRED EMBODIMENTS

In the following detailed description, reference is made to various specific embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The terms "substrate" and "wafer" are used interchangeably in the following description and are to be understood to include any semiconductor-based structure that has an exposed semiconductor surface. The semiconductor structure should be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation. Thus, the term substrate or wafer includes not only the semiconductor (silicon)-based layer 10 (FIG. 1), by itself, but also layer 10 in combination with other overlying layers, for example, a layer 11 (FIG. 1) containing MOS transistors fabricated over the silicon-based layer.

The term "metal" is intended to include not only elemental metal, but metal with other trace metals or in various alloyed combinations with other metals as known in the semiconductor art, as long as such alloy retains the physical and chemical properties of the metal. The term "metal" is also intended to include conductive oxides of such metals.

No particular order is required for the method steps described below, with the exception of those logically requiring the results of prior steps. Accordingly, while many of the steps discussed below are discussed as being performed in an exemplary order, this order may be altered.

The invention provides a method of forming an MRAM structure that has the bottom magnetic layer, the "pinned layer," recessed within a trench formed in an insulating layer provided over a substrate, with the top magnetic layer, the "free layer," positioned over this pinned layer within spacers provided in an opening in which the top magnetic layer is formed. The spacers reduce the opening size which allows for an accurate placement and self-alignment of the top magnetic layer of the MRAM over the pinned layer. The area defined by the spacers is typically smaller than conventional lithographic limitations would allow, thereby reducing the smallest feature sizes that can be printed and aligned.

Figure 1:
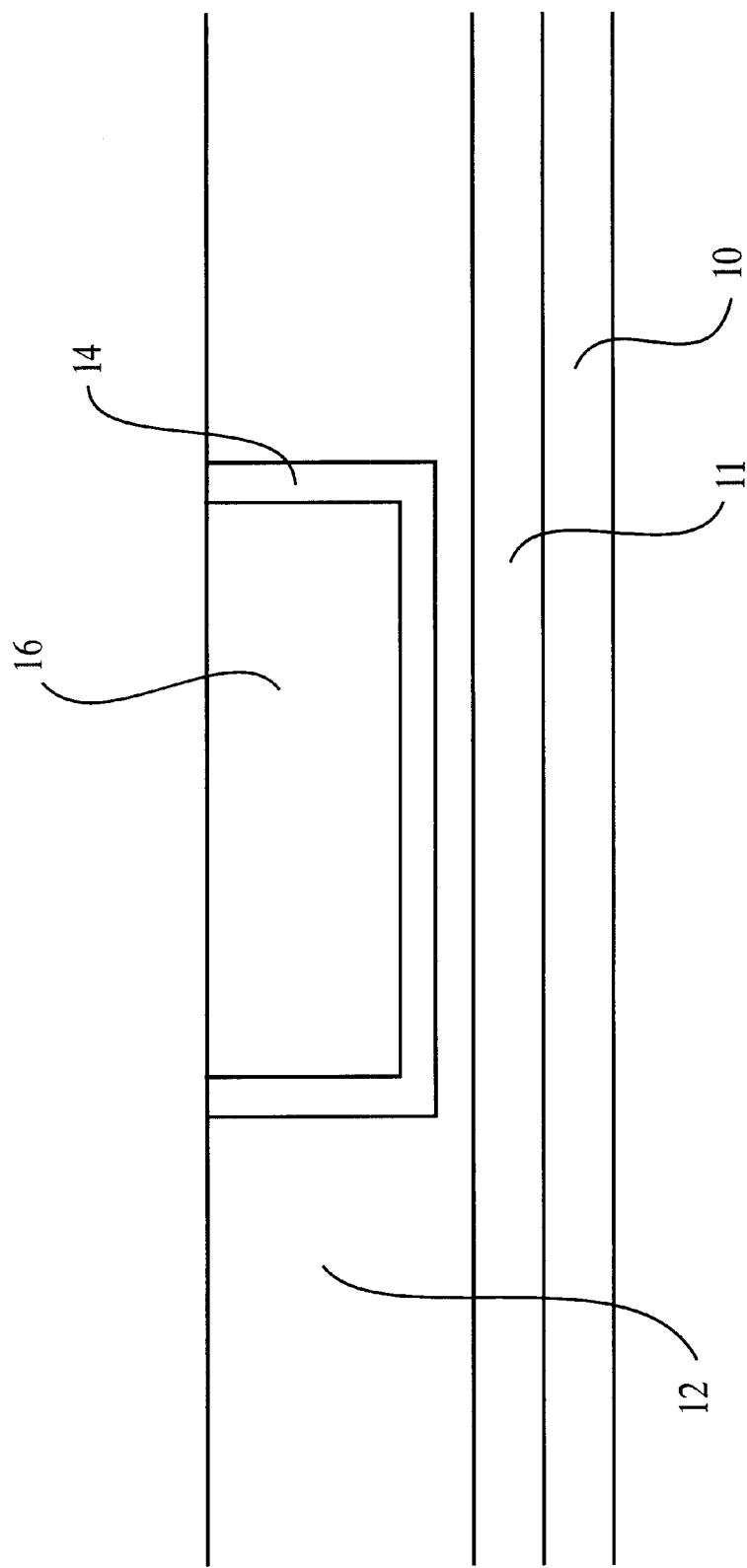
FIG. 1 is an illustration of an intermediate stage of processing of the MRAM device according to the invention.

Referring now to the drawings, where like elements are designated by like reference numerals, FIG. 1 depicts a cross-section of an MRAM memory cell during an intermediate stage of processing, wherein a silicon substrate 10 and a layer 11 having CMOS access and logic transistors fabricated within it are provided. The CMOS access transistors (not shown) can be fabricated over the silicon substrate 10 and within layer 11 in the regions around and outside the periphery of the MRAM array to control the functioning (reading and writing) of the MRAM devices. Other CMOS transistors, such as logic or dencoder transistors, can be fabricated in this same layer 11, but directly under the MRAM array. Other spatial arrangements of the access and logic transistors within layer 11 may also be used. The location of transistors within layer 11 conserves valuable surface space on the wafer. The substrate, including layers 10 and 11, is a planarized structure over which the MRAM device is to be fabricated in accordance with this invention.

As shown in FIG. 1, a first insulating layer 12 is formed over the layer 11. The insulating layer 12 can be an oxide such as TEOS, SiO, $SiO_2$, or a CVD nitride layer, or other insulating materials with similar properties, and should be about 1,000–10,000 Angstroms thick. Formation of this insulating layer 12 be accomplished as known in the art by any convenient means, such as by chemical vapor deposition or by oxidation of a deposited layer. This first insulating layer 12 is patterned with a photoresist and etched to form trenches in regions where the bottom layers of MRAM stacks 34 (see FIG. 4) are to be formed. By this etching step, a plurality of parallel trenches are formed within the first insulating layer 12 across the wafer to a depth of about 500–2,000 Å.

A tantalum (Ta) barrier layer 14 is conformally deposited within the trenches formed in the first insulating layer 12. This barrier layer 14 can also be TiN, TiW, TiCr, or Ti. The tantalum barrier layer 14 may be deposited by any convenient means, including low pressure chemical vapor deposition (LPCVD) or sputtering to a thickness of about 100 Å. This tantalum layer 14 serves as an adhesion layer and an etch stop layer. It also serves as a barrier layer to prevent the migration of copper into the wafer. Over this tantalum layer 14 is deposited a conductive layer of copper 16. The conductive layer 16 can also be aluminum, tungsten, gold, or other conductive materials used in the art. The copper layer 16 can be deposited by electroplating or by sputtering to be approximately 2000 Å thick. This copper layer 16 serves as a conducting line for the bottom magnetic layer and is the bottom electrode for the MRAM device. It will be connected to periphery CMOS controlling transistors which regulate the reading and writing of the memory cells. After the deposition of layers 14, 16 within the trench, any of these materials remaining over the top of the first insulating layer 12 is removed and the surface is planarized by chemical mechanical polishing (CMP), resulting in the structure shown in FIG. 1.

Figure 2:
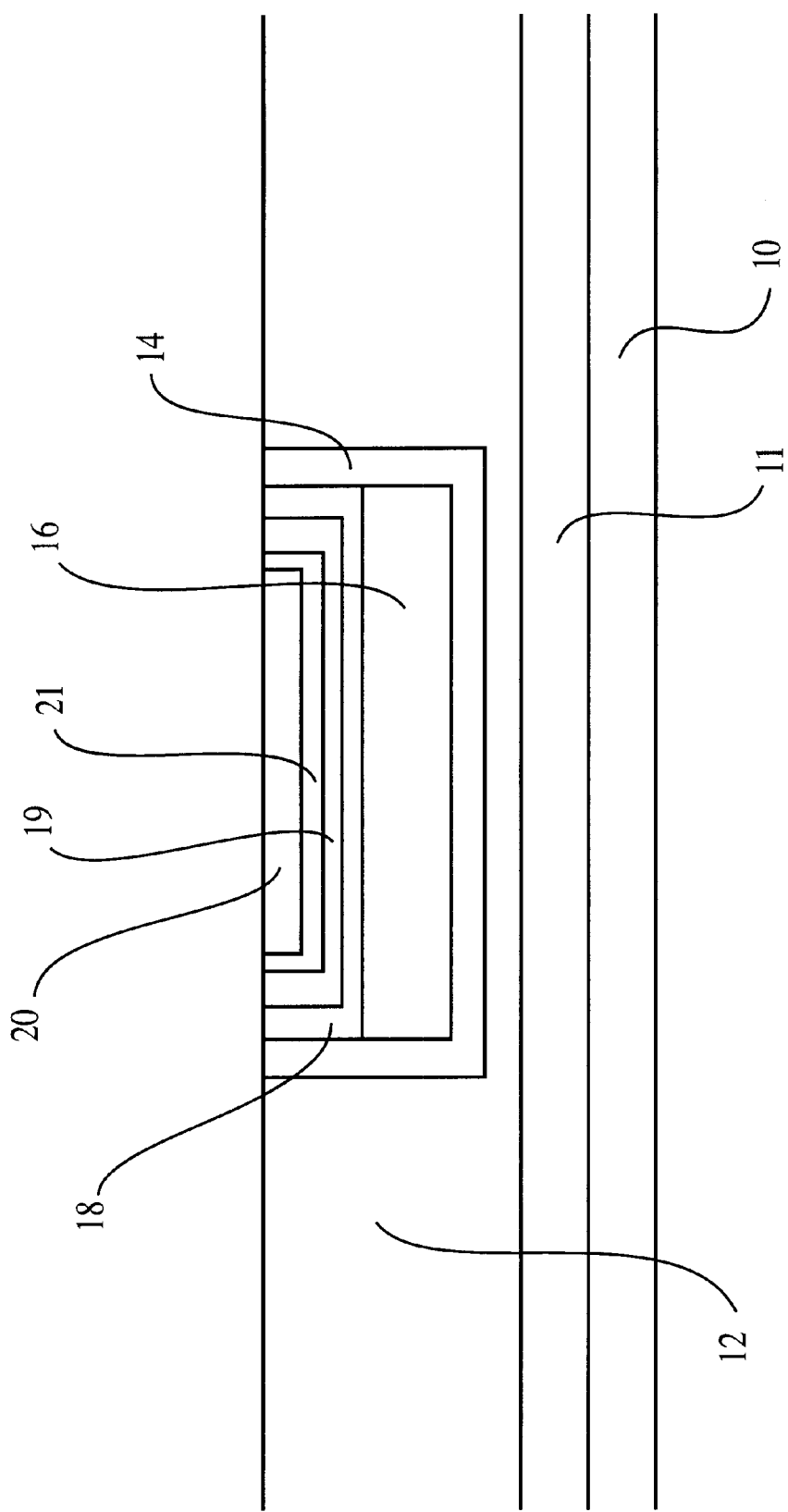
FIG. 2 is an illustration of a stage of processing of the MRAM device according to the invention, subsequent to the stage illustrated in FIG. 1.

Referring to FIG. 2, a recessed region is formed at the upper surface of the copper layer 16. This recessed region may be formed by utilizing a photo-etching method or by utilizing a spin etching option. After forming the recessed region over the copper layer 16, a second tantalum layer 18 (about 20–400 Å thick) is conformally deposited within the recess, again a sputtering method can be used to achieve this and this second tantalum layer 18 again serves as a barrier layer to prevent copper migration. Over this second tantalum layer 18 is deposited the material for the bottom magnetic layer.

A seed layer 19 is first formed over the second tantalum layer 18. This seed layer 18 supports proper crystal growth of the subsequent layers leading to the M1 layer 20. The seed layer 19 can comprise nickel iron (NiFe) and can be about 10–100 Å thick. Over the seed layer 19 is formed an antiferromagnetic layer 21. This layer is used to pin the M1 layer 20. The antiferromagnetic layer 21 can be made of iron manganese (FeMn) and can be about 10–100 Å thick. Layers 19, 18, and 21 can be deposited by any convenient means. Over this antiferromagnetic layer 21 is formed the M1 layer 20.

The M1 layer 20 may be deposited by any convenient method, such as chemical vapor deposition (CVD), low pressure chemical vapor deposition (LPCVD), sputtering, or by evaporation technique, and should be between about 10–100 Å thick. The M1 layer 20 may be one or more layers of any of a variety of materials, or alloys, with good magnetic properties, preferably nickel iron (NiFe), but may also be any similar compounds or alloys. This M1 layer 20 will form the pinned magnetic layer, meaning that the magnetic orientation of the layer is fixed and will not shift during the reading and writing of the MRAM device. This M1 layer 20 is pinned because of its association with the underlying antiferromagnetic layer 21, thereby creating a single magnetic orientation, which does not change. Any excess material deposited for the M1 layer 20 (and the underlying layers 14, 16, 18, 19, and 21) is removed and the wafer polished by chemical mechanical polishing (CMP), resulting in the structure shown in FIG. 2. The wafer is next cleaned of any unwanted residue or material.

Upon completion of the M1 layer 20, longitudinally extending rows of the bottom portions of the MRAM device stacks are complete. These bottom portions stretch across the substrate in substantially parallel rows. The remaining portions of the MRAM devices, the top portions, are to be formed as stacks over these rows to create complete MRAM cells over the substrate.

Figure 3:
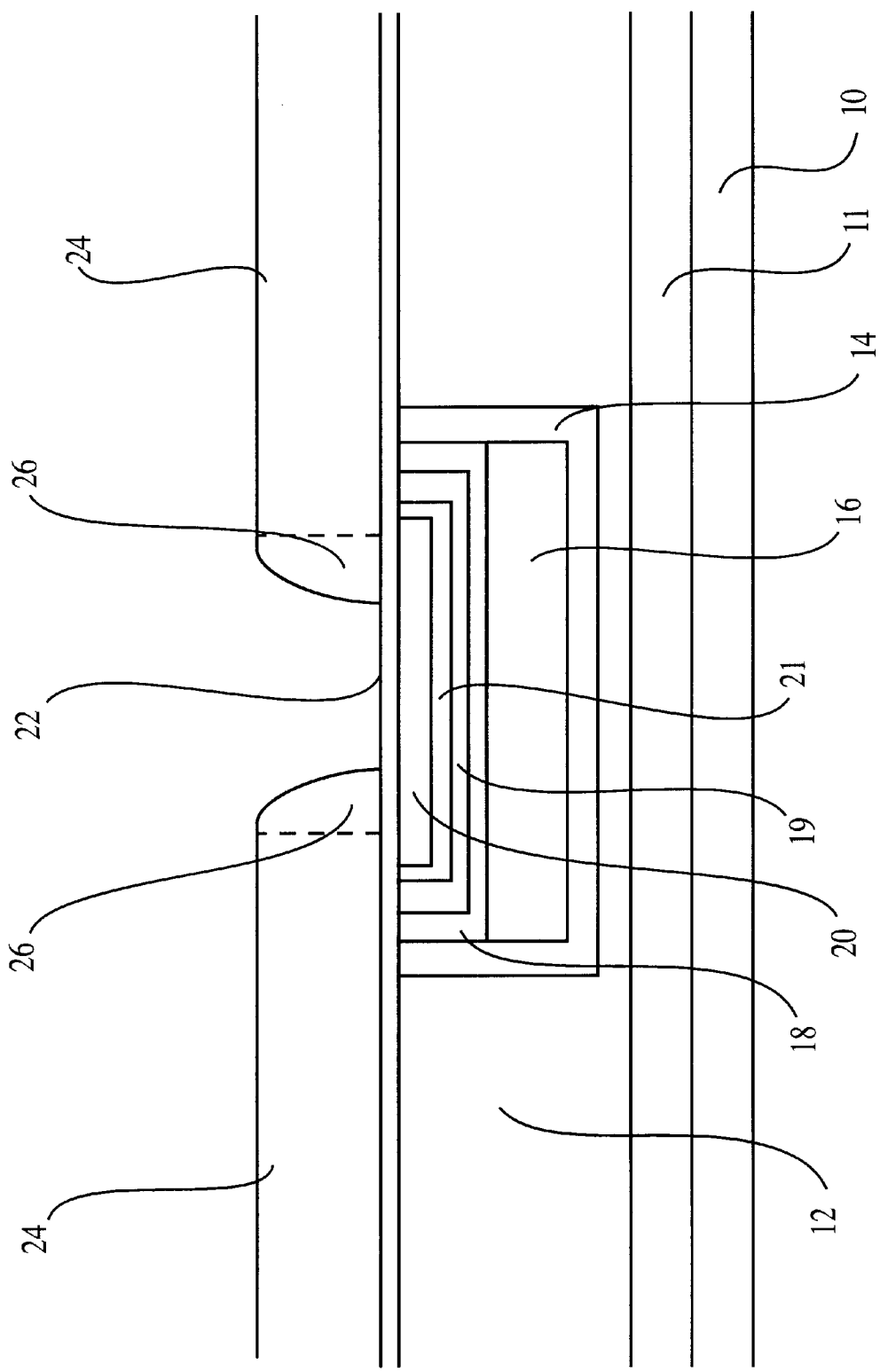
FIG. 3 is an illustration of a stage of processing of the MRAM device according to the invention, subsequent to the stage illustrated in FIG. 2.

Referring to FIG. 3, a layer of non-magnetic material 22 is deposited to a thickness of about 5–25 Å over the first insulating layer 12, the first tantalum layer 14, the second tantalum layer 18, the seed layer 19, the antiferromagnetic layer 21, and the M1 layer 20. This non-magnetic layer 22 can be aluminum oxide ($Al_2O_3$) (or TiO, MgO, $SiO_2$, or AlN) and in the case of $Al_2O_3$ can be formed by depositing an aluminum film over the substrate 10 and layer stacks, and then oxidizing the aluminum film by an oxidation source, such as RF oxygen plasma. Over this non-magnetic layer 22 is deposited a second insulating layer 24, such as an oxide layer. The insulating layer 24 can be deposited by CVD (chemical vapor deposition) and should be about 500–600 Å thick.

The second insulating layer 24 is patterned over regions along the length of the M1 layer 20 and etched by standard photolithographic methods as known in the art. The etched portion of the second insulating layer 24 should be over regions of the M1 layer 20 so as to expose portions the non-magnetic layer 22 over the M1 layer 20. Next, within the voids left by the etched-away portions of the second insulating layer 24, nitride spacers 26 are formed on the interior sidewalls of the voids in the second insulating layer 24. The nitride spacers 26 should be formed so that the top magnetic layers (M2) 28 (see FIG. 4) may later be formed in the regions between them over the non-magnetic layer 22. The nitride spacers 26 can be formed as a silicon nitride ($Si_3N_4$) layer, which may be deposited by any convenient method, such as by sputtering. The silicon nitride is then dry-etched, leaving the nitride spacers 26 on the side walls of the second insulating layer 24 and exposing the non-magnetic layer 22. The underlying non-magnetic layer 22 should act as an etch stop layer, if not, the non-magnetic layer 22 should be re-deposited between the nitride spacers 26 and over the underlying M1 layer 20 by sputtering.

The spacer creation process provides upper corner rounding at the corners of the second insulating layer 24. Such corner rounding is next transferred to the M2 layer. Corner rounding of the magnetic layer provides advantages in conservation of energy during MRAM operation. The rounded structure improves the magnetic character of the device and allows the M1 layer to induce more current into the M2 layer. It also allows the M2 layer to produce less "cross-talk," or negative induction between adjacent M1 or M2 layers.

The resulting structure after completion of the preceding stage of processing is shown in the cross-section depicted in FIG. 3. Another advantage of this method is that the regions between the nitride spacers 26 where the M2 layer 28 will later be formed (see FIG. 4) can be made smaller than is possible by the photolithography methods used in the prior art. Additionally, because the location of the regions between the nitride spacers 26 may be controlled to be anywhere over the M1 layer 20, the process of forming the M2 layer 28 is simple and self-aligning.

Figure 4:
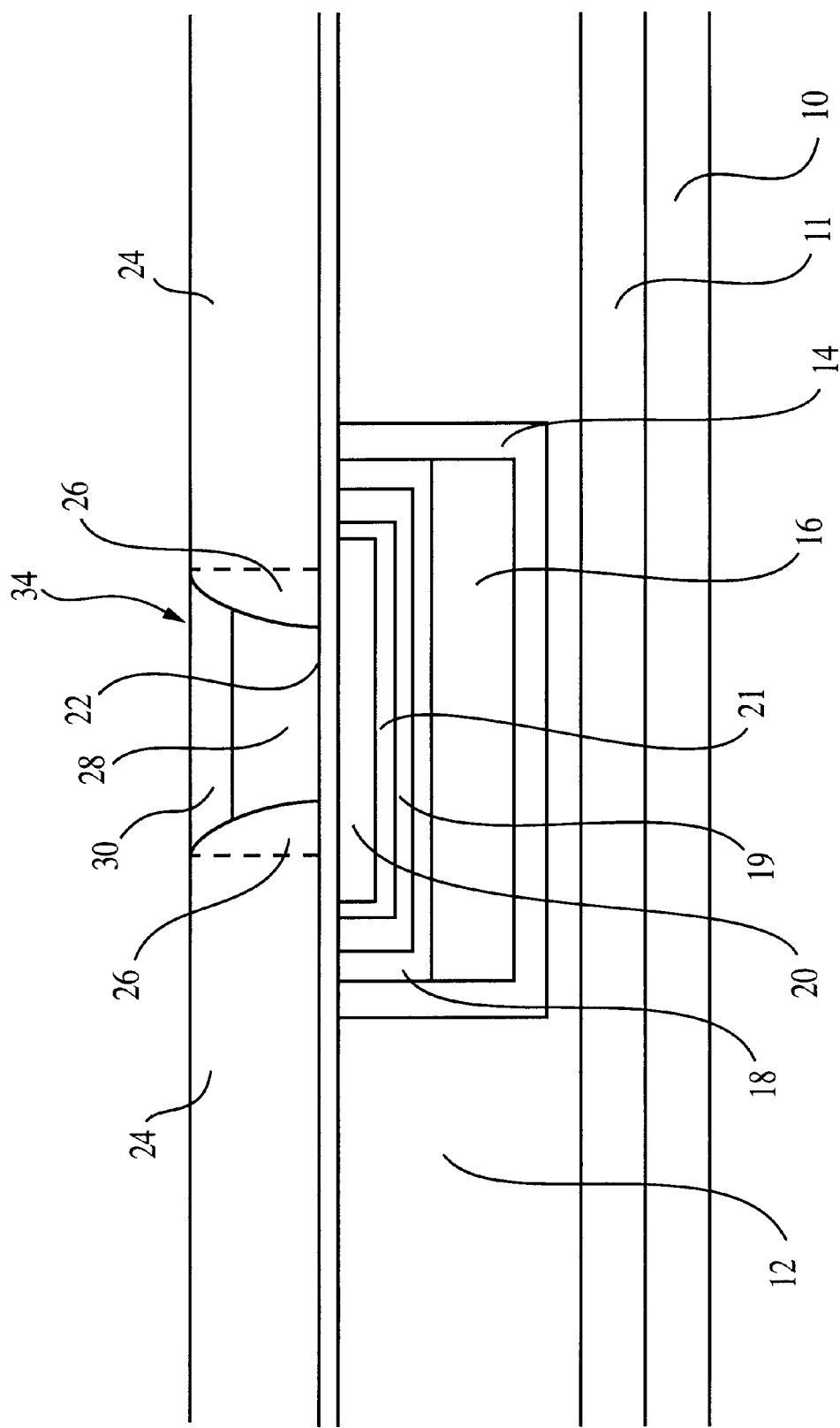
FIG. 4 is an illustration of a stage of processing of the MRAM device according to the invention, subsequent to the stage illustrated in FIG. 3.

Referring now to FIG. 4, the top magnetic layer (M2) 28 is deposited within the plurality of areas within and defined by the nitride spacers 26 and over the non-magnetic, non-conductive layer 22. The M2 layer 28 should be between about 10–100 Å thick. The M2 layer 28 can be comprised of nickel iron.

The M2 layer 28 should be formed to a level recessed below the surface of the nitride spacers 26 and the second insulating layer 24. Excess M2 layer 28 material can be removed by etching and polishing, or other convenient means, to leave such a recess. Over the M2 layer 28 and within the recess between the nitride spacers 26 a third tantalum barrier layer 30 is formed to a thickness of about 20–400 Å. This third tantalum layer 30 can be planarized with the top of the nitride spacers 26 and the second insulating layer 24. This may be accomplished by CMP. This third tantalum layer 30 will serve as another barrier layer to prevent migration of copper, used in a upper electrode, formed over the M2 layer 28 in subsequent processing steps. Upon formation of this third tantalum layer 30, the MRAM stack 34 is complete.

Figure 5:
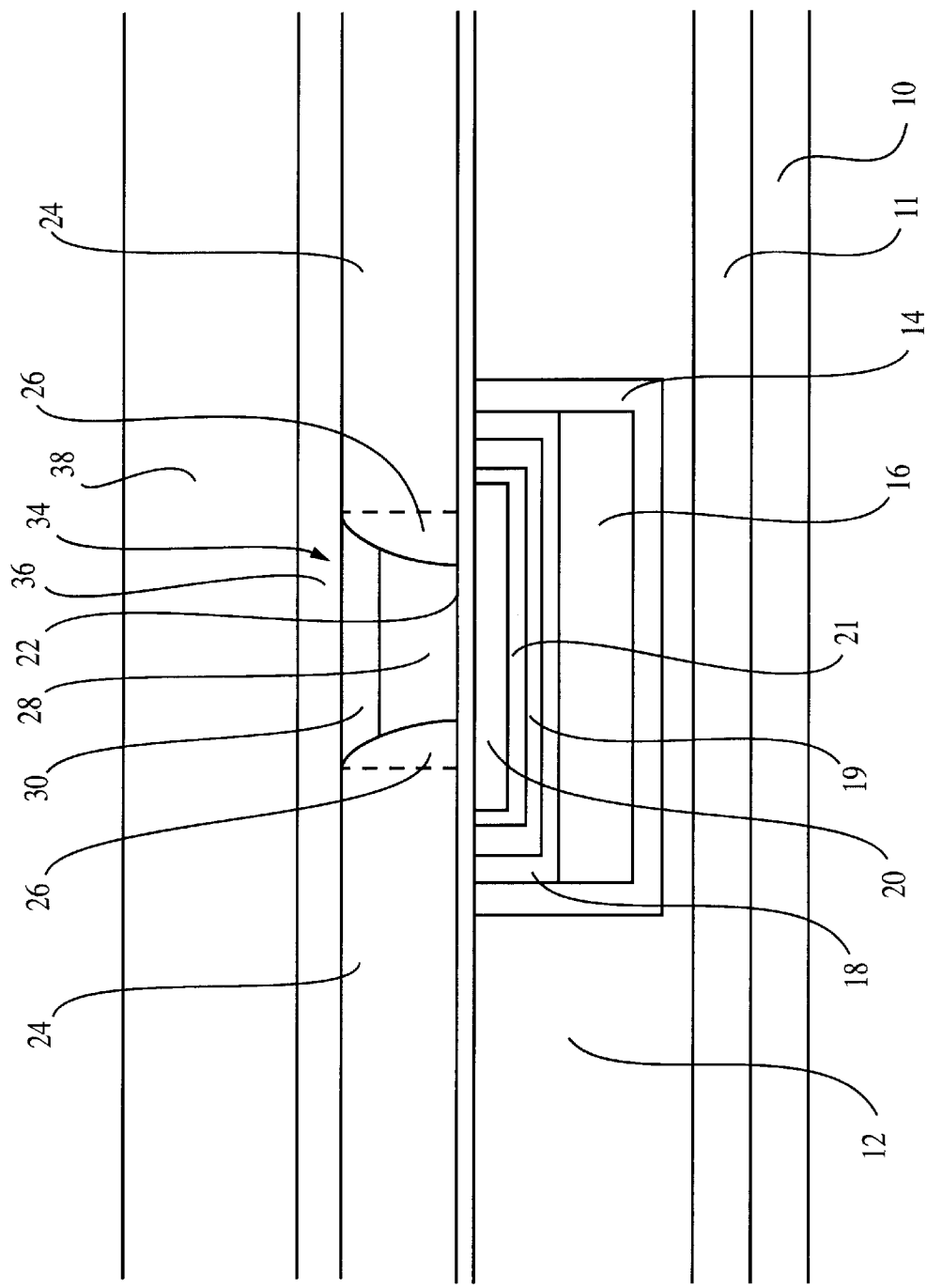
FIG. 5 is an illustration of a stage of processing of the MRAM device according to the invention, subsequent to the stage illustrated in FIG. 4.

Over the now formed MRAM stack 34, the nitride spacers 26, and the second insulating layer 24, a third insulating layer 32, which can be an oxide layer, can be formed as shown in FIG. 4. This third insulating layer 32 serves as an insulating layer for the MRAM stack 34. The third insulating layer 32 should be about 1200 Å thick. As illustrated in FIG. 5, a conductive interconnect line 36 can be formed over this insulating layer 32 and in connection with the third tantalum layer 30 through an opening in the third insulating layer 32. The interconnect line may be formed by first exposing the third tantalum layer 30 (by etching or polishing). A conductive material, such as copper, is deposited over and in contact with the third insulating layer 32. The conductive layer can be about 2000 Å thick over the third insulating layer 32. The conductive layer is next patterned and etched to form the interconnect line 36 orthogonal to the M1 layer 20 and copper interconnect layer 16 below. This interconnect line 36 connects multiple M2 layer 28 regions over different MRAM stacks 32 having different bottom M1 layer 20 (see FIG. 6) rows and serves as the upper electrode. Over this interconnect line 36 is formed a fourth insulating layer 38, which can be an oxide layer, to a thickness of approximately 5000 Å. This fourth insulating layer 38 may also be TEOS or CVD nitride, or any similar materials, and the resulting structure is shown in FIG. 5.

Figure 6:
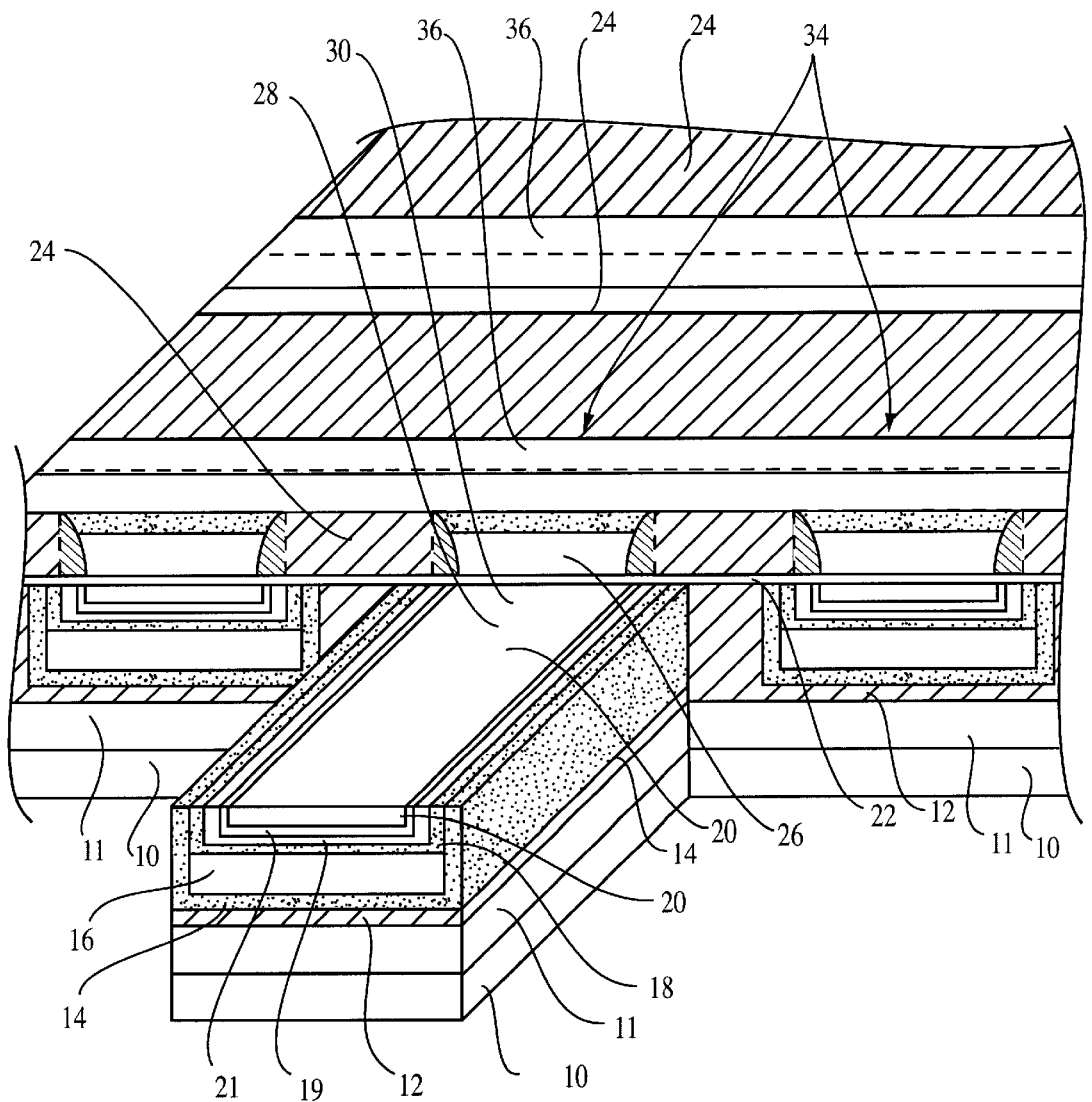
FIG. 6 is a cutaway perspective view of the integrated MRAM device according to the invention, illustrating the relationship between a plurality of MRAM memory cells.

The upper interconnect lines 36 connected to the M2 layers 28 (see FIG. 6) and the conductive copper layer 16 lines are connected to the M1 layer 20. Both lines may be connected to CMOS transistors fabricated in layer 11, which operate the associated MRAM cells. As shown in FIG. 6, the bottom portions of the MRAM stacks 34 (layers 14, 16, 18, 19, 21, and 20) overlying the substrate layers (10, 11) are arranged in rows extending longitudinally over the wafer. The upper portions of the MRAM stacks 34 (layers 28 and 30) are positioned as discrete islands over the bottom portions and the non-magnetic layer 22, and within the spacer structures 26. Upper interconnect lines 36 (the upper electrodes) are positioned orthogonally to the bottom portions of the MRAM stacks 34 and over conductive plugs to the upper portions of the MRAM stacks 34. FIG. 6 shows the relation of these various layers to one another in a cut-away perspective view, showing the extending characteristic of the bottom portion of the MRAM stacks 34 and the MRAM devices completed by the interconnect lines 36.

A second level of integration may be accomplished by repeating the processing steps described above in relation to FIGS. 1–6, beginning with forming a second trench in the fourth insulating layer 38. The second level of MRAM stacks 32 can be formed within and over trenches in this layer 38 utilizing the same processing steps described above and illustrated in FIGS. 1–6.

Figure 7:
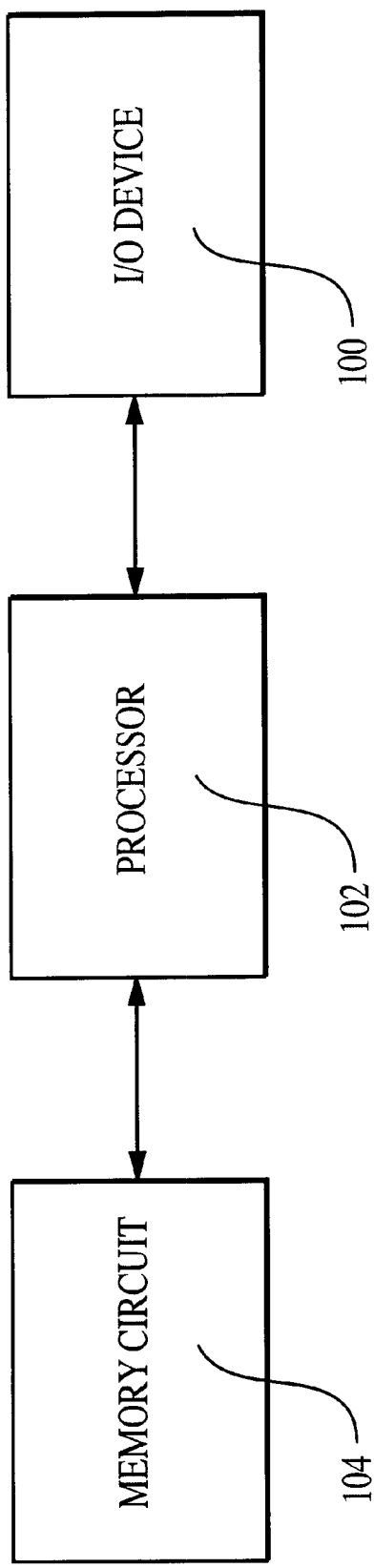
FIG. 7 is an illustration of a processor-based system incorporating the MRAM device according to the invention.

FIG. 7 illustrates a processor system (e.g., a computer system), with which a memory having a MRAM memory device, as described above, may be used. The processor system comprises a central processing unit (CPU) 102, a memory circuit 104, and an input/output device (I/O) 100. The memory circuit 104 contains an MRAM device constructed in accordance with the present invention. Also, the CPU 102 may itself be an integrated processor, which is integrated with an MRAM memory 104 constructed in accordance with the present invention, on a single chip.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A method of forming an MRAM device, comprising:

forming a trench in a first insulating layer over a substrate forming a bottom magnetic layer within said trench;

forming a second insulating layer over said bottom magnetic layer;

forming an opening in said second insulating layer over said bottom magnetic layer;

forming at least one spacer structure over said bottom magnetic layer and within said opening in said second insulating layer, said at least one spacer structure comprising sidewalls on vertical regions of said second insulating layer, said sidewalls defining a first region over said bottom magnetic layer; and forming a top magnetic layer within said first region defined by said at least one spacer structure.

2. The method of claim 1, wherein the act of forming said bottom magnetic layer comprises:

forming a first conductive layer within said trench; and forming said bottom magnetic layer within said trench and over said first conductive layer.

3. The method of claim 2, wherein the act of forming said bottom magnetic layer further comprises:

forming a first barrier layer within said trench, wherein said first conductive layer is formed over said first barrier layer;

forming a second barrier layer over said first conductive layer and within said trench;

forming a seed layer over said second barrier layer and within said trench;

forming an antiferromagnetic layer over said seed layer and within said trench, wherein said bottom magnetic layer is formed over said antiferromagnetic layer; and planarizing said bottom magnetic layer, said antiferromagnetic layer, said seed layer, said barrier layers and said first conductive layer, using said second insulating layer as a stop layer.

4. The method of claim 3, further comprising:

forming a non-magnetic layer over said bottom magnetic layer;

forming said second insulating layer over said non-magnetic layer;

depositing an insulating material and etching said material to form said at least one spacer structure on said sidewalls of said second insulating layer and to expose said non-magnetic layer;

forming said top magnetic layer over said non-magnetic layer;

forming a third barrier layer over said top magnetic layer and within said first region of said at least one spacer structure.

5. The method of claim 4, further comprising:

forming a third insulating layer over said second insulating layer, said at least one spacer structure, and said third barrier layer;

removing a portion of said third oxide layer to expose said third barrier layer; and forming a conductive interconnect line over said third oxide layer, in electrical contact with said top magnetic layer, said conductive interconnect line being orthogonal to said bottom magnetic layer.

6. The method of claim 5, wherein said barrier layers comprises tantalum.

7. The method of claim 5, wherein said first conductive layer comprises copper.

8. The method of claim 5, wherein said seed layer comprises nickel iron.

9. The method of claim 5, wherein said antiferromagnetic layer comprises iron manganese.

10. The method of claim 5, wherein said bottom magnetic layer comprises nickel iron.

11. The method of claim 5, wherein said first conductive layer is a bottom electrode and said conductive interconnect line is a upper electrode.

12. The method of claim 5, wherein said non-magnetic layer comprises aluminum oxide.

13. The method of claim 5, wherein said insulating layers are formed of a material selected from the group consisting of oxides and nitrides.

14. The method of claim 5, wherein said top magnetic layer comprises nickel iron.

15. The method of claim 5, wherein said conductive interconnect line comprises copper.

16. The method of claim 5, wherein act of removing said portion of said second insulating layer comprises etching.

17. The method of claim 5, wherein act of removing a portion of said third insulating layer comprises etching.

18. The method of claim 5, further comprising forming a fourth insulating layer over said conductive interconnect line and said third insulating layer.

19. A method of forming an MRAM memory device, comprising:

forming a non-magnetic layer over a bottom magnetic layer;

forming an insulating layer over said non-magnetic layer;

removing a plurality of portions of said insulating layer to expose said non-magnetic layer where over said bottom magnetic layer;

forming a plurality of spacer structures where said plurality of portions of said insulating layer were removed, said spacer structures being formed so as to leave portions of said non-magnetic layer exposed; and forming a top magnetic layer within said plurality of spacer structures and over a non-magnetic layer.

20. The method of claim 19, further comprising:

forming a first oxide layer over a substrate;

forming a trench in said first oxide layer, said trench extending longitudinally over said substrate;

forming a conductive layer within said trench;

forming said bottom magnetic layer over said conductive layer and within said trench;

forming said non-magnetic layer over said bottom magnetic layer and said first oxide layer; and forming said insulating layer over said non-magnetic layer, said insulating layer being a second oxide layer.

21. The method of claim 20, further comprising:

forming a first barrier layer within said trench, wherein said conductive layer is formed over said first barrier layer;

forming second barrier layer over said conductive layer and within a recessed region of said conductive layer;

forming a seed layer over said second barrier layer and within said recessed region of said conductive layer;

forming an antiferromagnetic layer over said seed layer and within said recessed region of said conductive layer, wherein said bottom magnetic layer is formed over said antiferromagnetic layer and within said recessed region.

22. The method of claim 21, further comprising:

forming a third barrier layer over said top magnetic layer and within said plurality of spacer structures;

forming a plurality of interconnect lines over and connected to each said third barrier layer, said plurality of interconnect lines being orthogonal to said bottom magnetic layer.

23. The method of claim 22, wherein the act of forming a plurality of interconnect lines comprises:

forming a fourth oxide layer over said third oxide layer and said third barrier layer;

removing a plurality of portions of said fourth oxide layer over said third barrier layer to expose said third barrier layer; and forming said plurality of interconnect lines over said fourth oxide layer and said third barrier layer.

24. The method of claim 23, wherein the act of removing said plurality of portions of said second oxide layer comprises etching.

25. The method of claim 23, wherein the act of removing said plurality of portions of said fourth oxide layer comprises etching.

26. The method of claim 23, wherein said barrier layers comprises tantalum.

27. The method of claim 23, wherein said first conductive layer comprises copper.

28. The method of claim 23, wherein said seed layer comprises nickel iron.

29. The method of claim 23, wherein said antiferromagnetic layer comprises iron manganese.

30. The method of claim 23, wherein said bottom magnetic layer comprises nickel iron.

31. The method of claim 23, wherein said non-magnetic layer comprises aluminum oxide.

32. The method of claim 23, wherein said insulating layer is formed of a material selected from the group consisting of oxides and nitrides.

33. The method of claim 23, wherein said top magnetic layer comprises nickel iron.

34. The method of claim 23, wherein said plurality of interconnect lines comprise copper.

35. The method of claim 23, wherein said plurality of interconnect lines are upper electrodes and said conductive layer is a bottom electrode.

* * * * *